United States Patent [19]
Jacobson

[11] Patent Number: 5,572,661
[45] Date of Patent: Nov. 5, 1996

[54] METHODS AND SYSTEM FOR DETECTING DATA LOSS IN A HIERARCHIC DATA STORAGE SYSTEM

[75] Inventor: Michael B. Jacobson, Boise, Id.

[73] Assignee: Hewlett-Packard Company, Palo Alto, Calif.

[21] Appl. No.: 319,331

[22] Filed: Oct. 5, 1994

[51] Int. Cl.$^6$ ................................................. G06F 11/34
[52] U.S. Cl. ...................................................... 395/182.05
[58] Field of Search ............................. 395/575, 425, 395/600, 275, 427, 650, 400, 182.05, 183.01, 183.18, 401, 404, 405, 406, 413, 417, 441, 444, 490, 492, 497.01, 497.02; 365/200, 201; 364/474.16, 474.19, 550, 580, 738; 371/40.1; 324/512

[56] References Cited

U.S. PATENT DOCUMENTS

| | | | |
|---|---|---|---|
| 4,985,828 | 1/1991 | Shimizu et al. | 364/200 |
| 5,095,420 | 3/1992 | Eilert et al. | 395/400 |
| 5,155,835 | 10/1992 | Belsan | 395/425 |
| 5,195,100 | 3/1993 | Katz et al. | 371/66 |
| 5,237,658 | 8/1993 | Walker et al. | 395/200 |
| 5,278,838 | 1/1994 | Ng et al. | 371/101 |
| 5,287,462 | 2/1994 | Jibbe et al. | 395/275 |
| 5,289,418 | 2/1994 | Youngerth | 365/201 |
| 5,297,258 | 3/1994 | Hale et al. | 395/275 |
| 5,319,758 | 6/1994 | Arai et al. | 395/400 |
| 5,392,244 | 2/1995 | Jacobson et al. | 365/200 |
| 5,522,031 | 5/1996 | Ellis et al. | 395/182.04 |

OTHER PUBLICATIONS

RAIDBook: A Source Book For RAID Technology, published Jun. 9, 1993, by the RAID Advisory Board, Lino Lakes, Minn.

*Primary Examiner*—Robert W. Beausoliel, Jr.
*Assistant Examiner*—Stephen C. Elmore

[57] ABSTRACT

Data loss is selectively tracked within a hierarchic data storage system having multiple storage disks that define a physical storage space. The physical storage space is mapped into a first virtual storage space which presents the physical storage space as multiple RAID areas that store data according to various RAID levels, such as RAID Level 1 (mirror redundancy) or RAID Level 5 (parity redundancy). Individual RAID areas extend across multiple storage disks and include a region of physical storage space on individual storage disks. The first virtual storage space is mapped into a second virtual storage space which presents the physical storage space as multiple virtual blocks. The RAID areas are monitored to detect data loss. Upon detecting data loss within a region of a RAID area, this first region is marked as invalid. Upon detecting data loss within a second region of the same RAID area, the data storage system will determine the extent of data loss. If the data loss is comparatively minor, the data storage system will identify the virtual block that is mapped onto the portion of the second region and mark it defective. The address of the virtual block is stored in a virtual data loss table to indicate that data stored in that block is unreliable. If the data loss in the second region is significant, or if the virtual data loss table becomes full, the data loss will cause the entire RAID area to be classified as "dead".

19 Claims, 9 Drawing Sheets

FIG. 1

DISKS

| 0 | 1 | 2 | 3 | STRIPE NUMBER |
|---|---|---|---|---|
| 0 | 0' | 1 | 1' | 0 |
| 2 | 2' | 3 | 3' | 1 |
| 4 | 4' | 5 | 5' | 2 |
| 6 | 6' | 7 | 7' | 3 |
| * | * | * | * | * |
| * | * | * | * | * |
| * | * | * | * | * |
| T−1 | T−1' | T | T' | S |

Fig 2
PRIOR ART

DISKS

| 0 | 1 | 2 | 3 | STRIPE NUMBER |
|---|---|---|---|---|
| 0 | 1 | 2 | P | 0 |
| 3 | 4 | P | 5 | 1 |
| 6 | P | 7 | 8 | 2 |
| P | 9 | 10 | 11 | 3 |
| * | * | * | * | * |
| * | * | * | * | * |
| * | * | * | * | * |
| P | R−2 | R−1 | R | Q |

METHODS AND SYSTEM FOR DETECTING DATA LOSS IN A HIERARCHIC DATA STORAGE SYSTEM

FIELD OF THE INVENTION

This invention relates to methods for detecting data loss in hierarchic data storage system. This invention also relates to a data storage system having data loss detection capabilities.

BACKGROUND OF THE INVENTION

Computer systems are constantly improving in terms of speed, reliability, and processing capability. As a result, computers are able to handle more complex and sophisticated applications. However, as computers improve, performance demands placed on mass storage and input/output (I/O) devices increase. In general, I/O performance has had difficulty keeping pace with the growing capabilities of the computers.

The mass storage industry faces two primary challenges: (1) to improve I/O performance so that data access does not become a limiting factor for an application, and (2) to provide access to on-line data at levels of reliability well in excess of the expected lifetimes of the computer systems that process it. See, *The RAIDBook: A Source Book for RAID Technology*, published Jun. 9, 1993, by the RAID Advisory Board, Linc Lakes, Minn. It is desirable that storage devices meet these goals in a cost-effective manner.

There are three primary design criteria for mass storage systems: cost, performance, and availability. It is most desirable to produce memory devices that have a low cost per megabyte, a high input/output performance, and high data availability. "Availability" is the ability to access data stored in the storage system and the ability to insure continued operation in the event of some failure. Typically, data availability is provided through the use of redundancy wherein data, or relationships among data, are stored in multiple locations.

There are two common methods of storing redundant data. According to the first or "mirror" method, data is duplicated and stored in two separate areas of the storage system. For example, in a disk array, the identical data is provided on two separate disks in the disk array. The mirror method has the advantages of high performance and high data availability due to the duplex storing technique. However, the mirror method is also relatively expensive as it effectively doubles the cost of storing data.

In the second or "parity" method, a portion of the storage area is used to store redundant data, but the size of the redundant storage area is less than the remaining storage space used to store the original data. For example, in a disk array having five disks, four disks might be used to store data with the fifth disk being dedicated to storing redundant data. The parity method is advantageous because it is less costly than the mirror method, but it also has lower performance and availability characteristics in comparison to the mirror method.

One problem in conventional disk arrays concerns data loss resulting from multiple failures. Conventional disk arrays are designed to maintain high data reliability by allowing for single failures without loss of data. This is achieved by maintaining some level of redundancy in the stored data. Unfortunately, multiple failures in certain combinations can lead to loss of data in all disk arrays. It is therefore desirable to avoid multiple failures in redundant disk array systems.

Another problem is that once data loss has occurred, conventional disk arrays often do not provide for detection of the data loss each time the lost data is read. Even if some detection is provided, the disk arrays tend to report more data loss than actually occurred. For instance, the conventional disk arrays may report data loss on an entire storage disk even though the actual loss may have been restricted to a small subset of the stored data, such as a few sectors on the storage disk. As a result, the otherwise good data on the storage disk is needlessly rendered unavailable to the user.

SUMMARY OF THE INVENTION

The present invention provides techniques for selectively tracking areas of data loss within the stored data when multiple failures lead to data loss. One benefit is the ability to detect and report the loss of specific areas of data when they are read while allowing continued access to the rest of the data stored in the disk array. The areas of data loss may be repaired without disturbing the configuration of the disk array and while maintaining the availability of the rest of the stored data by rewriting the areas of lost data.

One method of this invention concerns monitoring data loss in a hierarchic data storage system having multiple storage disks. These storage disks define a physical storage space. The physical storage space is mapped into a first virtual storage space which presents the physical storage space as multiple RAID areas that store data according to various RAID levels, such as RAID Level 1 (mirror redundancy) or RAID Level 5 (parity redundancy). Individual RAID areas extend across multiple storage disks and comprise a region of physical storage space on individual storage disks. When all regions are operable and data can be stored and retrieved therefrom, the associated RAID area is classified as "optimal". The first virtual storage space is mapped into a second virtual storage space which presents the physical storage space as multiple virtual blocks.

The RAID areas are monitored to detect data loss. Upon detecting data loss within a region of a RAID area, this first region is marked as invalid. As a result of losing this region, the data storage system can no longer ensure redundancy to the RAID area. The entire RAID area containing the invalid region is therefore classified as "degraded" whereby data can be stored and retrieved in the RAID area, but without redundancy.

Upon detecting data loss within a portion of a second region of the "degraded" RAID area, the data storage system will determine the extent of data loss. If the data loss is comparatively minor, the data storage system will identify the virtual block that is mapped onto the portion of the second region and mark it defective. The remaining portions of the second region and the remaining regions within the degraded RAID area can still be used. The address of the virtual block is stored in a virtual data loss table to indicate that data stored in that block is unreliable.

On the other hand, if the data loss in the second region is significant, or if the virtual data loss table becomes full, the data loss will cause the entire RAID area to be classified as "dead". Data cannot be recovered from the invalid regions within the dead RAID area.

DESCRIPTION OF THE DRAWINGS

Preferred embodiments of the invention are described below with reference to the following accompanying drawings depicting examples embodying the best mode for practicing the invention.

FIG. 7 is similar to FIG. 6, but also shows a second virtual view mapped onto the physical storage area. FIG. 7 illustrates a method in which data loss detected in a region of physical storage space is identified in the associated virtual block at the second virtual view.

FIG. 8 also illustrates the use of a virtual data loss table.

DETAILED DESCRIPTION OF THE INVENTION

This disclosure of the invention is submitted in furtherance of the constitutional purposes of the U.S. Patent Laws "to promote the progress of science and useful arts". U. S. Constitution, Article 1, Section 8.

Figure 1:
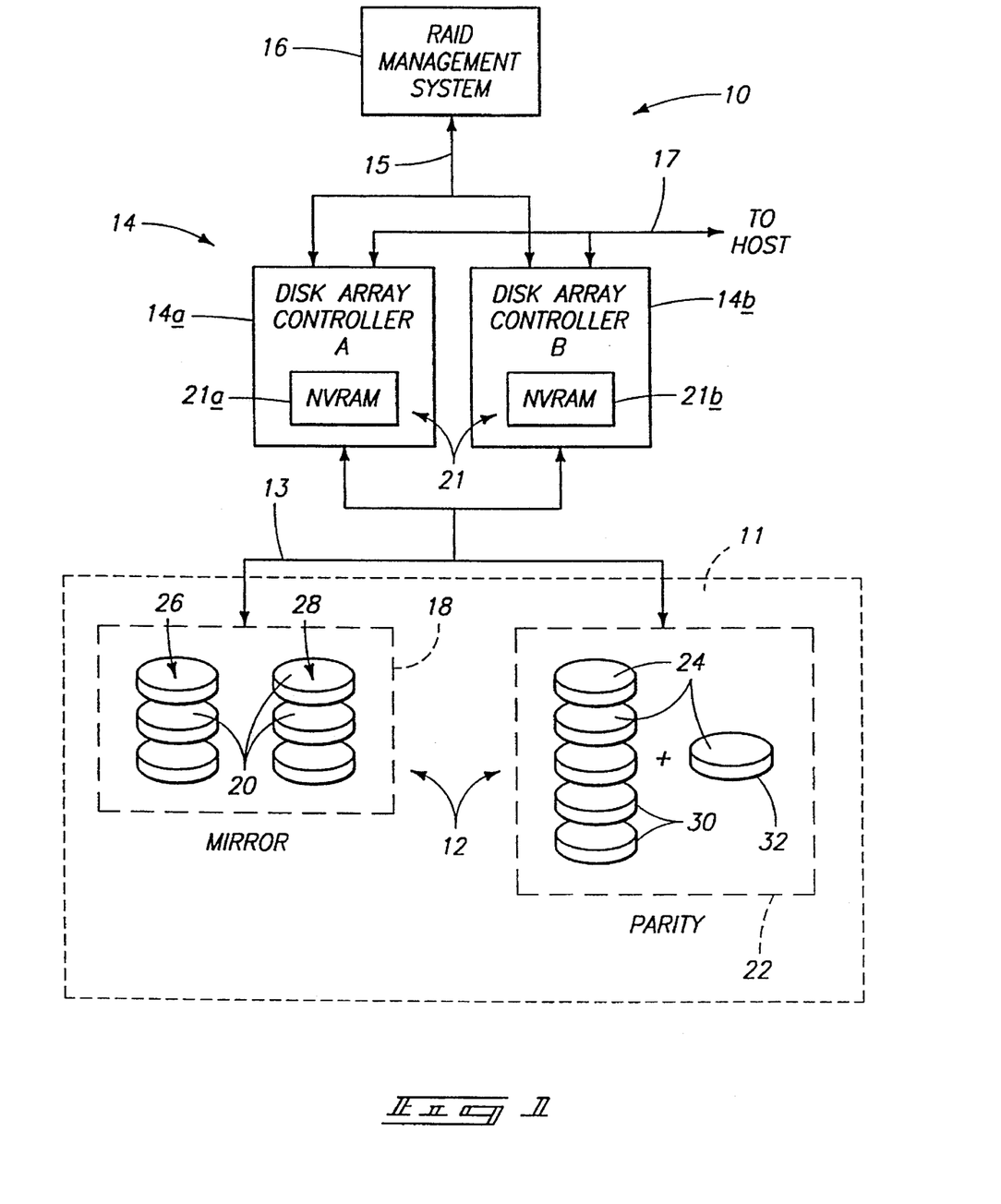
FIG. 1 is a diagrammatic block diagram of a disk array data storage system according to this invention.

FIG. 1 shows a data storage system 10 constructed according to this invention. Preferably, data storage system 10 is a disk array data storage system which includes a hierarchic disk array 11 having a plurality of storage disks 12, a disk array controller 14 coupled to the disk array 11 to coordinate data transfer to and from the storage disks 12, and a RAID management system 16.

For purposes of this disclosure, a "disk" is any non-volatile, randomly accessible, rewritable mass storage device which has the ability of detecting its own storage failures. It includes both rotating magnetic and optical disks and solid-state disks, or non-volatile electronic storage elements (such as PROMs, EPROMs, and EEPROMs). The term "disk array" is a collection of disks, the hardware required to connect them to one or more host computers, and management software used to control the operation of the physical disks and present them as one or more virtual disks to the host operating environment. A "virtual disk" is an abstract entity realized in the disk array by the management software.

The term "RAID" (Redundant Array of Independent Disks) means a disk array in which part of the physical storage capacity is used to store redundant information about user data stored on the remainder of the storage capacity. The redundant information enables regeneration of user data in the event that one of the array's member disks or the access path to it fails. A more detailed discussion of RAID systems is found in a book entitled, *The RAIDBook: A Source Book for RAID Technology*, published Jun. 9, 1993, by the RAID Advisory Board, Lino Lakes, Minn.

Disk array controller 14 is coupled to disk array 11 via one or more interface buses 13, such as a small computer system interface (SCSI). RAID management system 16 is operatively coupled to disk array controller 14 via an interface protocol 15. Data memory system 10 is also coupled to a host computer (not shown) via an I/O interface bus 17. RAID management system 16 can be embodied as a separate component, or configured within disk array controller 14 or within the host computer to provide a data manager means for controlling disk storage and reliability levels, and for transferring data among various reliability storage levels. These reliability storage levels are preferably mirror or parity redundancy levels as described below, but can also include a reliability storage level with no redundancy at all.

The disk array controller 14 is preferably implemented as a dual controller consisting of disk array controller A 14a and disk array controller B 14b. Dual controllers 14a and 14b enhance reliability by providing continuous backup and redundancy in the event that one controller becomes inoperable. This invention can be practiced, however, with a single controller or other architectures.

The hierarchic disk array 11 can be characterized as different storage spaces, including its physical storage space and one or more virtual storage spaces. These various views of storage are related through mapping techniques. For example, the physical storage space of the disk array can be mapped into a virtual storage space which delineates storage areas according to the various data reliability levels. Some areas within the virtual storage space can be allocated for a first reliability storage level, such as mirror or RAID level 1, and other areas can be allocated for a second reliability storage level, such as parity or RAID level 5. The various mapping techniques and virtual spaces concerning RAID levels are described below in more detail.

Data storage system 10 includes a memory map store 21 that provides for persistent storage of the virtual mapping information used to map different storage spaces into one another. The memory map store is external to the disk array, and preferably resident in the disk array controller 14. The memory mapping information can be continually or periodically updated by the controller or RAID management system as the various mapping configurations among the different views change.

Preferably, the memory map store 21 is embodied as two non-volatile RAMs (Random Access Memory) 21a and 21b which are located in respective controllers 14a and 14b. An example non-volatile RAM (NVRAM) is a battery-backed RAM. A battery-backed RAM uses energy from an independent battery source to maintain the data in the memory for a period of time in the event of power loss to the data storage system 10. One preferred construction is a self-refreshing, battery-backed DRAM (Dynamic RAM).

The dual NVRAMs 21a and 21b provide for redundant storage of the memory mapping information. The virtual mapping information is duplicated and stored in both NVRAMs 21a and 21b according to mirror redundancy techniques. In this manner, NVRAM 21a can be dedicated to storing the original mapping information and NVRAM 21b can be dedicated to storing the redundant mapping information. In an alternative construction, a mirrored memory map store can be configured using a single non-volatile RAM with sufficient space to store the data in duplicate.

As shown in FIG. 1, disk array 11 has multiple storage disk drive devices 12. Example sizes of these storage disks are one to three Gigabytes. The storage disks can be independently connected or disconnected to mechanical bays that provide interfacing with SCSI bus 13. In one implementation, the data storage system is designed with twelve active mechanical bays. Four SCSI buses are used to interface these bays with disk array controller 14 (i.e., one bus per three mechanical bays). If the active bays are fully loaded, the data storage system has an example combined capacity of 12–36 Gigabytes. Disk array controller 14 recognizes storage disks 12 regardless into which bay they are plugged. The data storage system 10 is designed to permit "hot plug" of additional disks into available mechanical bays in the disk array while the disk array is in operation.

The storage disks 12 in disk array 11 can be conceptualized, for purposes of explanation, as being arranged in a mirror group 18 of multiple disks 20 and a parity group 22 of multiple disks 24. Mirror group 18 represents a first memory location or RAID area of the disk array which stores data according to a first or mirror redundancy level. This mirror redundancy level is also considered a RAID Level 1. RAID Level 1, or disk mirroring, offers the highest data reliability by providing one-to-one protection in that every bit of data is duplicated and stored within the data storage system. The mirror redundancy is diagrammatically represented by the three pairs of disks 20 in FIG. 1. Original data can be stored on a first set of disks 26 while duplicative, redundant data is stored on the paired second set of disks 28.

Figure 2:
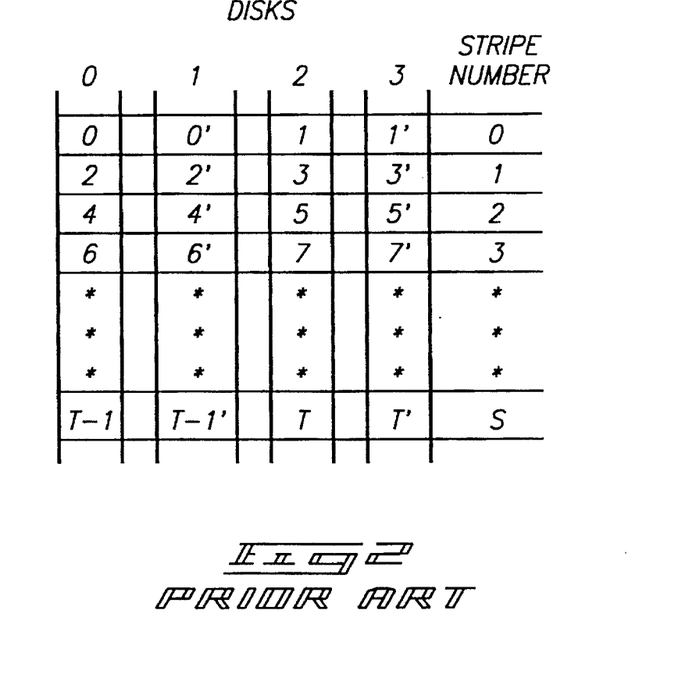
FIG. 2 is a diagrammatic illustration of storage space on multiple storage disks and shows data storage according to RAID Level 1.

FIG. 2 illustrates the storage of data according to RAID Level 1 in more detail. The vertical columns represent individual disks, of which disks 0, 1, 2, and 3 are illustrated. The physical storage space contained in this disk array of four disks can be configured into multiple stripes, as represented by the horizontal rows. A "stripe" extends across the storage disks and is comprised of numerous, equal sized segments of storage space where one segment is associated with each disk in the array. That is, a segment is the portion of a stripe that resides on a single disk. Each stripe holds a predetermined amount of data which is distributed across the storage disks. Some segments of a stripe are used for original data while other segments are used for redundant data.

In this example of mirror redundancy (RAID Level 1), data stored on disk 0 in segment 0 of stripe 0 is duplicated and stored on disk 1 in segment 0' of stripe 0. Similarly, data stored on disk 2 in segment 5 of stripe 2 is mirrored into segment 5' of stripe 2 on disk 3. In this manner, each piece of data is duplicated and stored on the disks. The redundancy layout of FIG. 2 is provided for explanation purposes is The redundant data need not be placed neatly in the same stripe as is shown. For example, data stored on disk 0 in segment 2 of stripe 1 could be duplicated and placed on disk 3 in segment T' of stripe S.

With reference again to FIG. 1, the parity group 22 of disks 24 represent a second memory location or RAID area in which data is stored according to a second redundancy level, such as RAID Level 5. In this explanatory illustration of six disks, original data is stored on the five disks 30 and redundant "parity" data is stored on the sixth disk 32.

Figure 3:
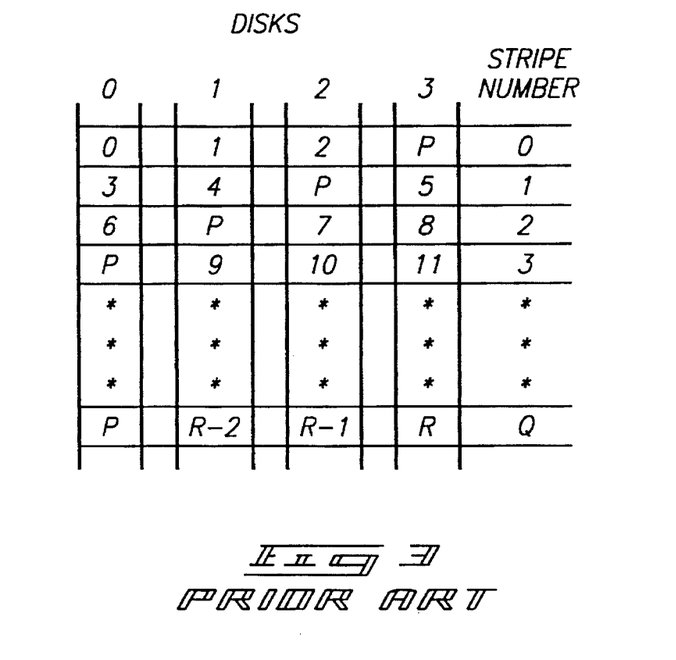
FIG. 3 is a diagrammatic illustration of storage space on multiple storage disks and shows data storage according to RAID Level 5.

FIG. 3 shows a parity RAID area layout in more detail. Similar to the mirror RAID area layout of FIG. 2, the physical storage space of disks 0, 1, 2, 3 can be configured into multiple equal sized stripes. In this illustrated example, data is stored according to RAID Level 5 and the redundant data stored in the segments is referenced by letter P. The redundant P segments store the parity of the other segments in the stripe. For example, in stripe 0, the redundant P segment on disk 3 stores the parity of disks 0, 1, and 2. The parity for each stripe is computed by some function, such as an exclusive OR function which is represented by the symbol "$\oplus$". The parities for the first four stripes (with the subscript numeral representing the corresponding stripe) are as follows:

$P_0$=Segment 0$\oplus$Segment 1$\oplus$Segment 2=Disk 0$\oplus$Disk 1$\oplus$Disk 2

$P_1$=Segment 3$\oplus$Segment 4$\oplus$Segment 5=Disk 0$\oplus$Disk 1$\oplus$Disk 3

$P_2$=Segment 6$\oplus$Segment 7$\oplus$Segment 8=Disk 0$\oplus$Disk 2$\oplus$Disk 3

$P_3$=Segment 9$\oplus$Segment 10$\oplus$Segment 11=Disk 1$\beta$Disk 2$\oplus$Disk 3

Parity redundancy allows regeneration of data which becomes unavailable on one of the disks. For example, if the data in segment 5 becomes unavailable, its contents can be ascertained from segments 3 and 4 and the parity data in segment P. Parity storage is less expensive than mirror storage, but is also less reliable and has a lower performance.

The disk arrangement of FIG. 1 is provided for conceptual purposes. In practice, the disk array 11 would simply have a plurality of disks 12 which are capable of storing data according to mirror and parity redundancy. Among the available storage space provided by all disks 12, a portion of that storage space would be allocated for mirror redundancy and another portion would be allocated for parity redundancy. Preferably, disks 12 are configured to contain plural, equal sized storage regions (referenced as numeral 35 in FIG. 4), wherein individual regions have multiple segments. The regions are grouped together to form RAID areas in one virtual view of the storage space. Additionally, another (host-defined) view of storage space is presented to the user or host so that the RAID areas and data redundancy storing techniques are transparent to the user or host. These features are discussed below in more detail with reference to FIG. 4.

Data storage system 10 manages the "migration" of data between mirror and parity storage schemes. The management of both types of redundancy is coordinated by RAID management system 16 (FIG. 1). RAID management system 16 manages the two different types of RAID areas in the disk array as a memory hierarchy with the mirror RAID areas acting similar to a cache for the parity RAID areas. RAID management system 16 shifts, organizes, and otherwise manages the data between the mirror and parity RAID areas in accordance with a defined performance protocol. The process of moving data between the mirror and parity RAID areas is referred to as "migration".

Data storage system 10 tries to place the more performance-critical data in the mirror RAID areas since this affords the highest performance and reliability. The performance protocols implemented by RAID management system 16 includes one of two preferred migration policies. According to the first migration policy, known as "access frequency", the most frequently accessed data on the hierarchic disk array is maintained in the mirror RAID area 18. Less frequently accessed data is maintained in the parity RAID area 22. According to a second migration policy, known as "access recency", the most recently retrieved data is maintained in the mirror RAID area 18 while the less recently accessed data is stored in parity RAID area 22.

Other performance protocols may be employed. Ideally, such protocols are defined based upon the specific computer application and the needs of the user.

Additionally, the RAID management system 16 automatically "tunes" the storage resources of a data storage system according to a function of two parameters: size of the physical storage capacity and size of the present amount of user data being stored in the data storage system. Initially, all data is stored in mirror RAID areas because this affords the highest performance and reliability. As more data is added to the data storage system, the data is migrated between mirror RAID areas and parity RAID areas to optimize performance and reliability. As the data storage system approaches full capacity, more and more data is migrated to parity RAID areas in an effort to meet all demands by the user while still providing reliability through redundancy. Accordingly, the data storage system of this invention affords maximum flexibility and adaptation. It does not require the user to select a specific storage regime, but instead can adapt to any demand placed on it by the user.

Figure 4:
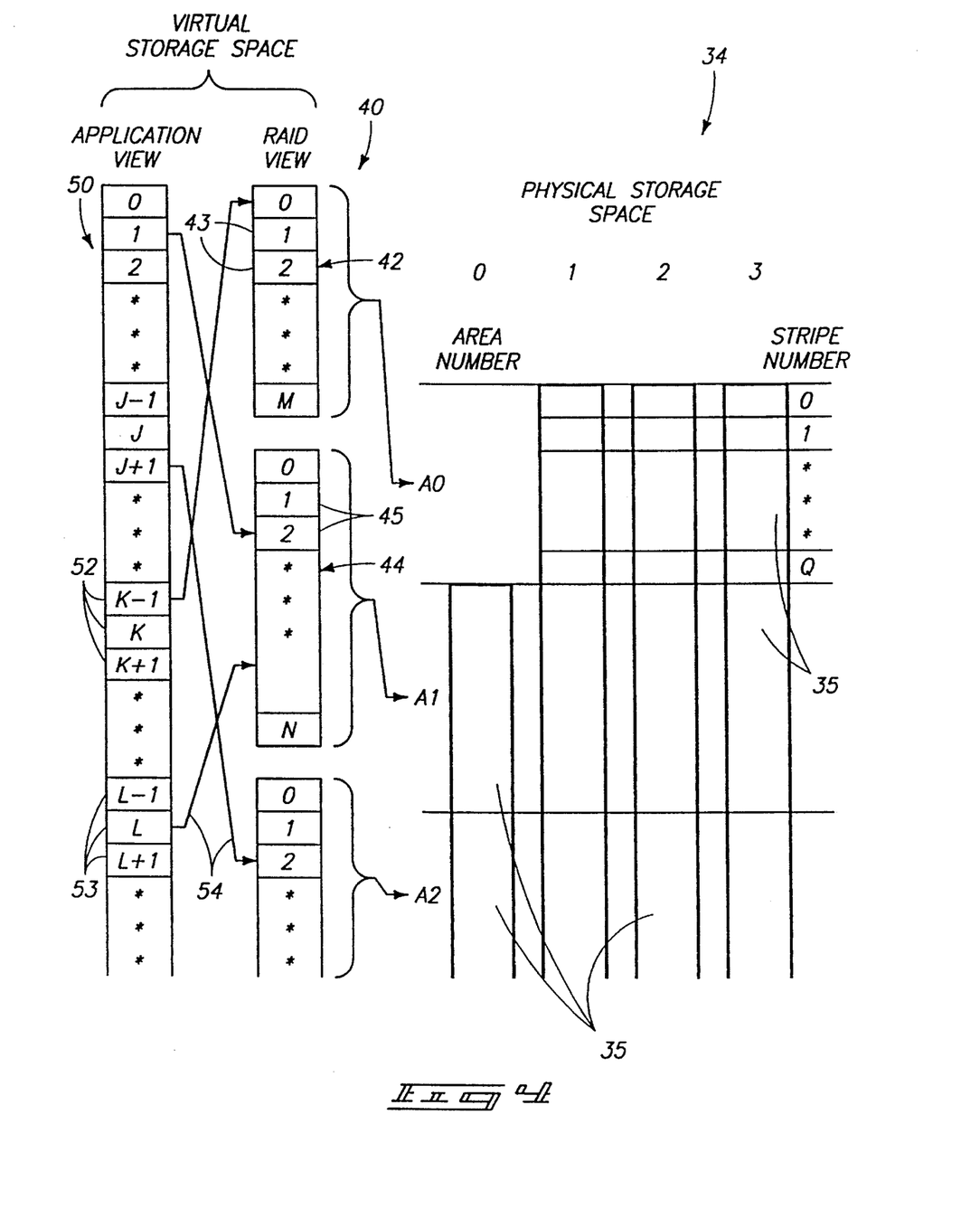
FIG. 4 is a diagrammatic illustration of a memory mapping arrangement of this invention where two virtual storage spaces are mapped with respect to a physical storage space.

FIG. 4 illustrates a memory mapping of the available storage space of data storage system 10 as multiple tiers of mapped virtual storage space. Each vertically elongated rectangle in the diagram represents a view of the physical storage space. In this diagram, physical storage space 34 is referenced by two virtual storage views 40 and 50. Physical storage space 34 is represented by four disks (such as disks 12 in FIG. 1) referenced by numerals 0, 1, 2, and 3. The four rectangles associated with the disks represent a view of the physical storage space wherein disks 1, 2, and 3 have approximately equal storage capacity, and disk 0 has slightly less storage capacity. Example storage capacities for such disks are 1–3 Gigabytes. The storage space 34 is partitioned into areas A0, A1, A2, etc. Individual areas contain numerous stripes, such as stripes 0-Q in area A0. Individual areas also contain numerous regions 35. Regions 35 preferably consist of a selected number of uniform sized segments on every storage disk so that the regions are equal in size across the entire disk array. An example size of one region 35 is one Megabyte.

The storage space of the disks are mapped into a first, intermediate, RAID-level virtual view 40 of the physical storage space 34. This first virtual view is conceptually a set of RAID areas which can be mapped to a second application view that represents a contiguously addressable storage space. The physical configuration and RAID views of the storage space are hidden from the application view.

The RAID area storage space 40 is the view of storage that identifies the mirror and parity storage space. For instance, a RAID area 42 may represent a mirror RAID area of M allocation blocks 43 while RAID area 44 may represent a parity RAID area of N allocation blocks 45. The allocation blocks 43 and 45 are preferably equal sized, with an example size being 64 Kilobytes. These RAID areas relate to corresponding physical areas A0, A1, A2, etc., on the physical storage space 34. As an example, sixteen 64K allocation blocks 43 or 45 at the RAID virtual view can be mapped onto a single 1M region 35.

The mirror and parity RAID areas may or may not consume the entire storage space 34 of the disk array. Accordingly, during certain applications, there may be unused and undesignated storage space that does not correspond to a particular RAID area. However, such storage space can be converted into a mirror or parity RAID area. It is also noted that the RAID areas are shown as being mapped into contiguous areas on the disk array, where each region associated with a RAID area is located at the same physical address on each storage disk. The RAID areas may alternatively be mapped into non-contiguous areas on the disk array as well.

The storage space available in the RAID areas is mapped into a second, front end, application-level virtual view 50 which is a view of storage as defined by and presented to the user or host application program. When viewed by the user or host application program, the application-level virtual view 50 can represent a single large storage capacity indicative of the available storage space on storage disks 12. Virtual storage space 50 presents a view of a linear set of equal sized storage virtual blocks 52 and 53, referenced individually as 0, 1, 2, . . . J–1, J, J+1, . . . , L–1, L, L+1, . . . , etc. Virtual blocks 52 and 53 are preferably the same size as the allocation blocks in RAID area 40, with an example size being 64 Kilobytes. The virtual block storage space 50 is represented by a table of references or pointers (as represented by arrows 54) to allocation blocks in the view presented by RAID areas 40. Virtual blocks 52 and 53 at the application virtual view 50 are therefore associated with allocation blocks 43 and 45 at the RAID virtual view 40 via the pointers maintained in the virtual block table. There are at least two types of RAID areas that can be referenced from the virtual block table: mirror and parity.

The RAID management system 16 can dynamically alter the configuration of the RAID areas over the physical storage space. The number of RAID areas for each type may be increased or decreased depending upon the amount of user data being stored in the system and the size of the physical disk storage space. As a result, the mapping of the RAID areas in the RAID-level virtual view 40 onto the disks and the mapping of the front end virtual view 50 to RAID view 40 are generally in a state of change. The memory map store in NVRAMs 21a and 21b (FIG. 1) maintains the current mapping information used by RAID management system 16 to map the RAID areas onto the disks, as well as the information employed to map between the two virtual views. As the RAID management system dynamically alters the RAID level mappings, it also updates the mapping information in the memory map store to reflect the alterations.

The migration operation of memory system 10 will now be described with reference to FIGS. 1 and 4.

For purposes of continuing explanation, virtual blocks 53 of the application-level virtual storage space 50 reference associated allocation blocks 45 in parity RAID area 44 stored in area A1 of physical storage space 34. Such virtual blocks 53 are referred to as "parity virtual blocks" while the associated allocation blocks 45 may be referred to as "parity allocation blocks". Similarly, virtual blocks 52 reference associated allocation blocks 43 in mirror RAID area 42 stored in area A0 of physical storage space 34. Such virtual blocks 52 may be referred to herein as "mirror virtual blocks" while the associated allocation blocks 43 are referred to as "mirror allocation blocks".

In general, to migrate data from one RAID area to another, a virtual block associated with an allocation block of a first RAID level type (such as mirror or Level 1) is selected. Then, an unused allocation block representing a second RAID level type (such as parity or Level 5) is located. If an unused allocation block cannot be located, one is created. Data is next transferred from the allocation block previously associated with the selected virtual block to the unused allocation block which causes the data to undergo a redundancy level change. For example, data once stored according to mirror redundancy would now be stored according to parity redundancy, or vice versa. As a final step, the mapping 54 of the application-level virtual storage space 50 to the RAID-level virtual storage space 40 is modified and updated to reflect the shift of data. The selected virtual block that was formerly associated with an allocation block of the first RAID level type now references via an updated pointer an allocation block of the second RAID level type which contains the migrated data. Any mapping change occurring during this transaction would be updated in memory map store 21.

The continuing discussion provides a more detailed explanation of migrating data between mirror and parity storage areas according to preferred methods and sequences of this invention. To migrate data from parity to mirror storage, the following sequence is employed:

1. The RAID management system locates an unused mirror allocation block 43 in a mirror RAID area 42.
2. If none can be found, the RAID management system creates a mirror allocation block (discussed below).
3. The RAID management system suspends new storage requests to the virtual block to be migrated.
4. The RAID management system waits until all active data storage requests to the virtual block are completed.
5. The data from the parity allocation block 45 associated with virtual block 53 is read into a temporary memory buffer.
6. The data is then written to the mirror allocation block 43 chosen in step 2.
7. The virtual block table is modified to reference the new location of the data in the mirror allocation block 43.
8. The suspended storage requests are resumed.

According to the above procedure, a virtual block 53 in the application-level virtual view 50 migrated from parity to mirror storage. Relative to the intermediate virtual view 40, data has migrated from a parity allocation block 45 in parity RAID area 44 to a mirror allocation block 43 in mirror RAID area 42. In the physical storage space, data has moved from area A1 to area A0.

If an unused mirror allocation block cannot be located (step 1 above), the RAID management system tries the following preferred sequence of three techniques. First, the RAID management system will try to locate an unused (and thus undesignated) RAID area, which can be converted to a mirror RAID area without violating the system threshold of unused RAID-level storage that is needed to guarantee that migration can always proceed. If this fails and the system has more than the reserved amount of unused RAID-level storage, the system migrates data within parity storage to collect unused parity allocation blocks into unused RAID areas. If this migration yields an unused RAID area that can be converted to a mirror RAID area as above, then the system converts it to a mirror RAID area. Otherwise, the system alternately migrates data from mirror to parity storage, packs mirror storage, and converts unused RAID-level storage to parity until the system increases unused RAID-level storage sufficiently for the location of an unused mirror allocation block or a conversion of an unused RAID area to a mirror RAID area. Since mirror allocation blocks occupy more physical storage space than parity allocation blocks, this last technique will result in a net increase in the amount of unused RAID-level storage.

The creation/conversion protocol used to locate and establish unused mirror allocation blocks is advantageous because it permits the RAID management system to selectively adjust the memory allocation between parity and mirror areas according to the amount of user data and the size of physical storage space. As data usage and storage capacity vary, the RAID management system employs one or more of the above three techniques to maximize the amount of data held in mirror storage.

The RAID management system attempts to avoid the situation in which a storage request must wait for the space-making sequence to yield an unused mirror allocation block by creating unused RAID areas during idle time. However, in some situations, storage requests may be suspended during the space-making sequence. The RAID management system configures the virtual block storage space in such a way that the virtual space will be smaller than the RAID view. This ensures that a free space equal to at least one RAID area is set aside for migration or other purposes. In this manner, the sequence of techniques will always yield an unused mirror allocation block.

To migrate data from mirror to parity storage, the following sequence is employed:

1. The RAID management system chooses a virtual block from 52 to migrate from mirror to parity storage according to a migration policy such as access recency or access frequency.
2. The RAID management system locates an unused parity allocation block 45 in a parity RAID area 44.
3. If such a block cannot be found, space reserved for migration is converted to a parity RAID area according to the above described creation techniques.
4. New storage requests to the virtual block to be migrated are suspended.
5. The RAID management system waits until all active storage requests to the virtual block are completed.
6. Data is read from the mirror allocation block 43 associated with virtual block 52 into a temporary memory buffer.
7. The data is written to the chosen parity allocation block 45.
8. The virtual block table is modified to reference the new location of the data in parity allocation block 45.
9. Data requests to the virtual block are resumed.

The above two nine-step sequences provide examples of how the memory system of this invention can operate to migrate data between two different levels of redundancy.

The redundancy hierarchic data storage system of this invention is designed to minimize data loss. Data loss occurs on a storage disk when some event or sequence of events take place that imply the data stored at a particular location on the disk has been inadvertently altered. After such an event, it is uncertain whether the data stored at the effected location is the same as it was prior to the event. Storage disks typically do not support a mechanism to remember whether such an event has occurred for each possible storage location. Rather, the storage disks simply report whether the storage location can be successfully accessed (read or write) when an access attempt is made. After a data loss event, the data itself is no longer reliable even though attempts to access the storage location that used to contain the data are successful.

Data loss events recognized by the disk array controller include failed write accesses and spares. A failed write access is considered a data loss event because a write failure reported by the storage disk indicates that an attempt was made to write the data to the associated storage location on the disk, but some or all of the data was not actually written. As a result, there is uncertainty regarding the contents of the storage location.

A spare is typically performed on a storage disk when a storage location can no longer be successfully accessed. For this reason, it is implicit in most disk controller implementations that no attempt be made to copy the contents of a storage location that has been identified to be spared to a new storage location during the sparing operation. In the process of sparing, the storage disk may also identify and communicate other storage locations in which the contents were not copied because they could not be read. Any storage location that was spared, but not copied, is an occurrence of data loss because the data now contained at the new storage location is known to not be the same as the data contained at the old storage location.

In the hierarchic data storage system of this invention, there are two types of data loss that can occur: "primitive" data loss and "compound" data loss. Primitive data loss is the loss of a physical fragment of data from a storage disk that is included in the space available for storage of user data. It occurs when the disk array controller 14 determines that a specific portion of data stored on a storage disk is no longer accurate or useful. In response, the controller makes an irreversible record of the loss so that data will never be used again. Compound data loss is a loss of virtual data after all mappings and redundancies have been applied that results from a combination of primitive data losses.

Figure 5:
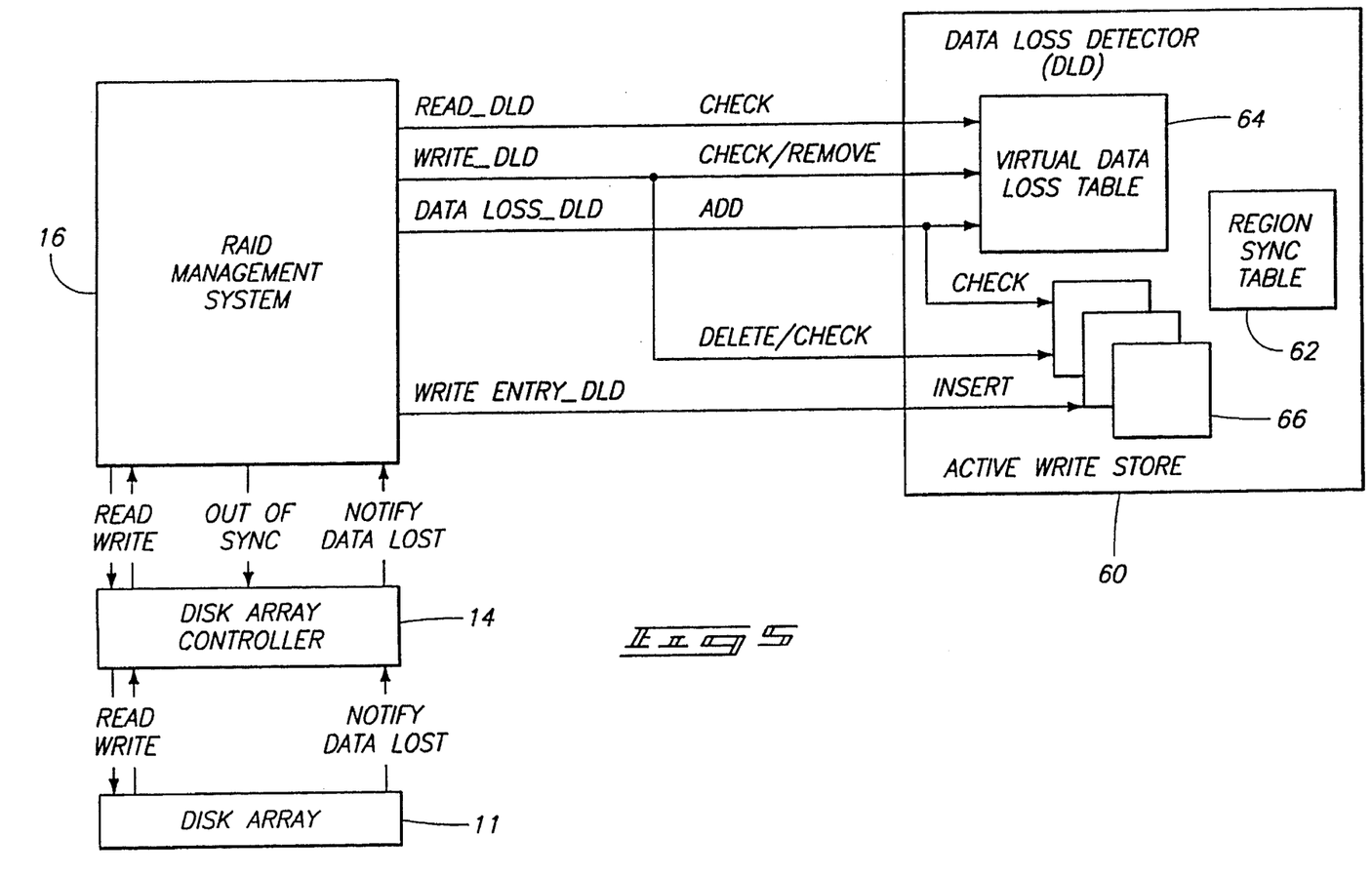
FIG. 5 is a diagrammatic block diagram of components and control flow related to data loss detection according to this invention.

FIG. 5 shows data storage system 10 implemented with a data loss detector 60 which seeks to minimize the extent of compound data loss. Data loss detector 60 tracks data loss that occurs within individual RAID areas. Data loss detector 60 monitors individual regions 35 associated with RAID areas to detect when primitive data loss has occurred in a region. Preferably, data loss detector 60 is implemented in firmware in the disk array controller 14, but is illustrated separately in FIG. 5 to facilitate discussion of the control flow.

The data loss detector includes a region sync table 62 which contains multiple indicators that represent whether individual regions are (1) valid and have not experienced any data loss or (2) invalid and have experienced some data loss. In a preferred implementation, the indicators consist of a single sync bit for each associated region. A sync bit of a first binary value, such as binary "1", indicates that the corresponding region is valid and has not experienced any data loss. Conversely, a sync bit of a second binary value, such as a binary "0", indicates that the corresponding region is invalid and has experienced data loss. Since there is only a single bit to map the sync state for the entire region, the whole region is regarded as invalid or "out of sync" when the sync bit is a binary "0".

Figure 6:
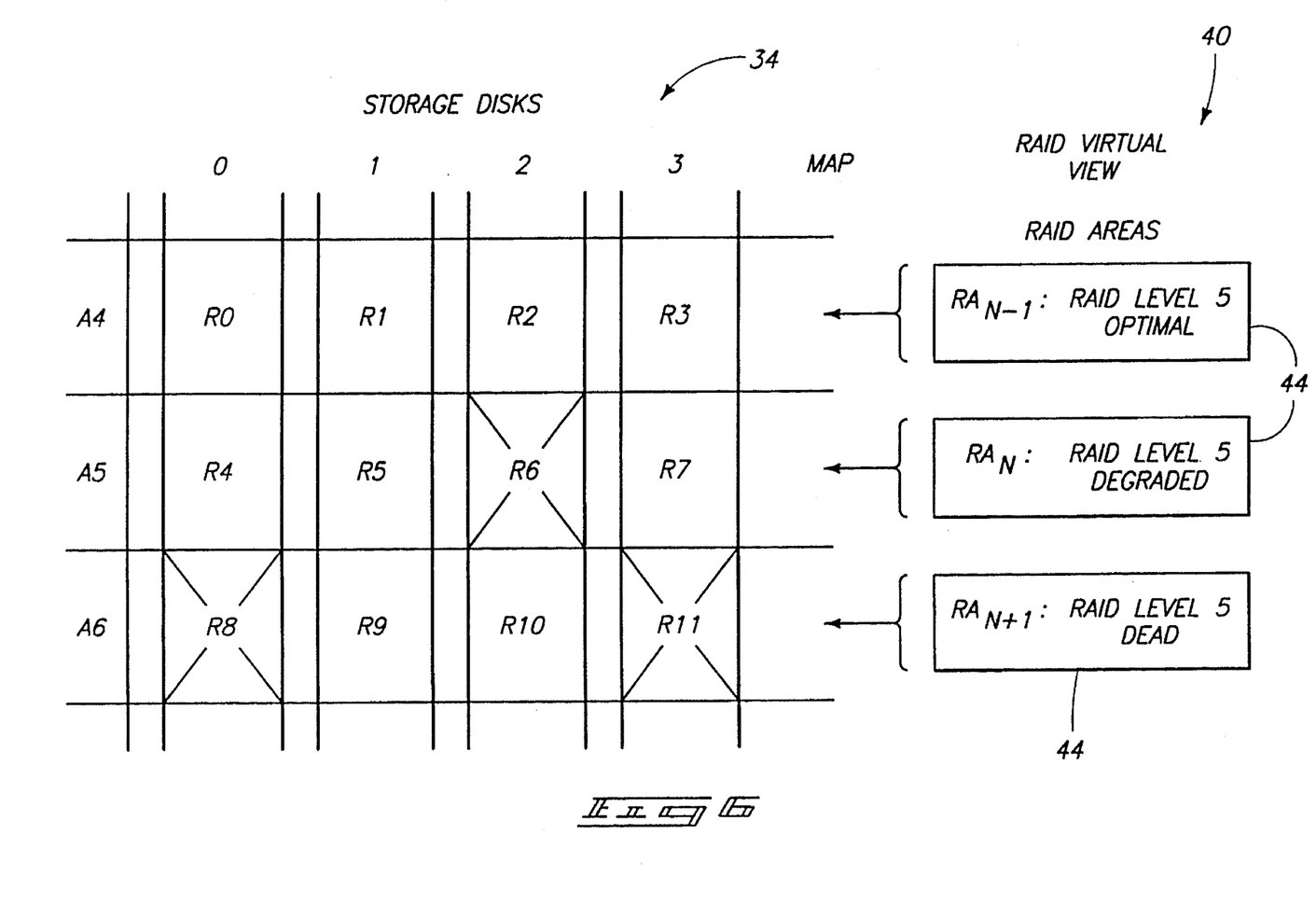
FIG. 6 is a diagrammatic illustration of storage space on multiple storage disks and shows RAID areas mapped onto the physical storage space to comprise regions from individual storage disks.

As illustrated in FIG. 6, each RAID area can be classified in one of three states based upon the status of the regions contained therein. A RAID area is classified as "optimal" when all regions are valid as indicated by all sync bits being a binary "1". Parity RAID area $RA_{N-1}$ is optimal because all regions R0, R1, R2, and R3 on physical storage area A4 of the disk array that it maps onto are valid. Data stored in this RAID area can be stored and retrieved with full redundancy.

A RAID area is classified as "degraded" when one region has been identified as invalid or out of sync. Parity RAID area $RA_N$ is an example of a degraded area due to region R6 being invalid (as represented by the "X" through the region). The sync bit corresponding to region R6 is at a binary "0". Data is still available in the "degraded" RAID area, but there is no longer full redundancy.

A RAID area is classified as "dead" when two or more regions have been declared invalid. Parity RAID area $RA_{N+1}$ is an example of a dead area because regions R8 and R11 have both been marked as invalid. Data cannot be recovered from the invalid regions within a dead RAID area, although data in the remaining regions of the dead RAID area can be directly accessed. Combination data loss has occurred in a dead RAID area because both redundant copies of at least some of the data has been lost.

The data storage system 10 attempts to avoid creation of dead RAID areas. Accordingly, the data loss detector 60 is configured to identify one or more virtual blocks in the second virtual storage space that are mapped onto the sectors of the region responsible for the data loss. These virtual blocks are tagged as defective to maintain an up-to-date record of data loss. By tracking individual 64K virtual blocks and sectors therein, the data storage system can more selectively identify specific sectors of data loss, rather than declaring the entire 1M region invalid. Other portions of the region can remain open for data access.

Data loss detector 60 includes a virtual data loss table 64 and an active write list 66. Virtual data loss table 64 stores the virtual addresses of the defective virtual blocks, or more particularly, the addresses of specific sectors within the virtual blocks. The table records combination data loss at the virtual block level in an effort to avoid dead RAID areas. As long as space exists in the table, a dead RAID area can be avoided by recording the defective virtual blocks, as opposed to marking the entire region as invalid which might otherwise result in classifying the whole RAID area as dead.

Figure 7:
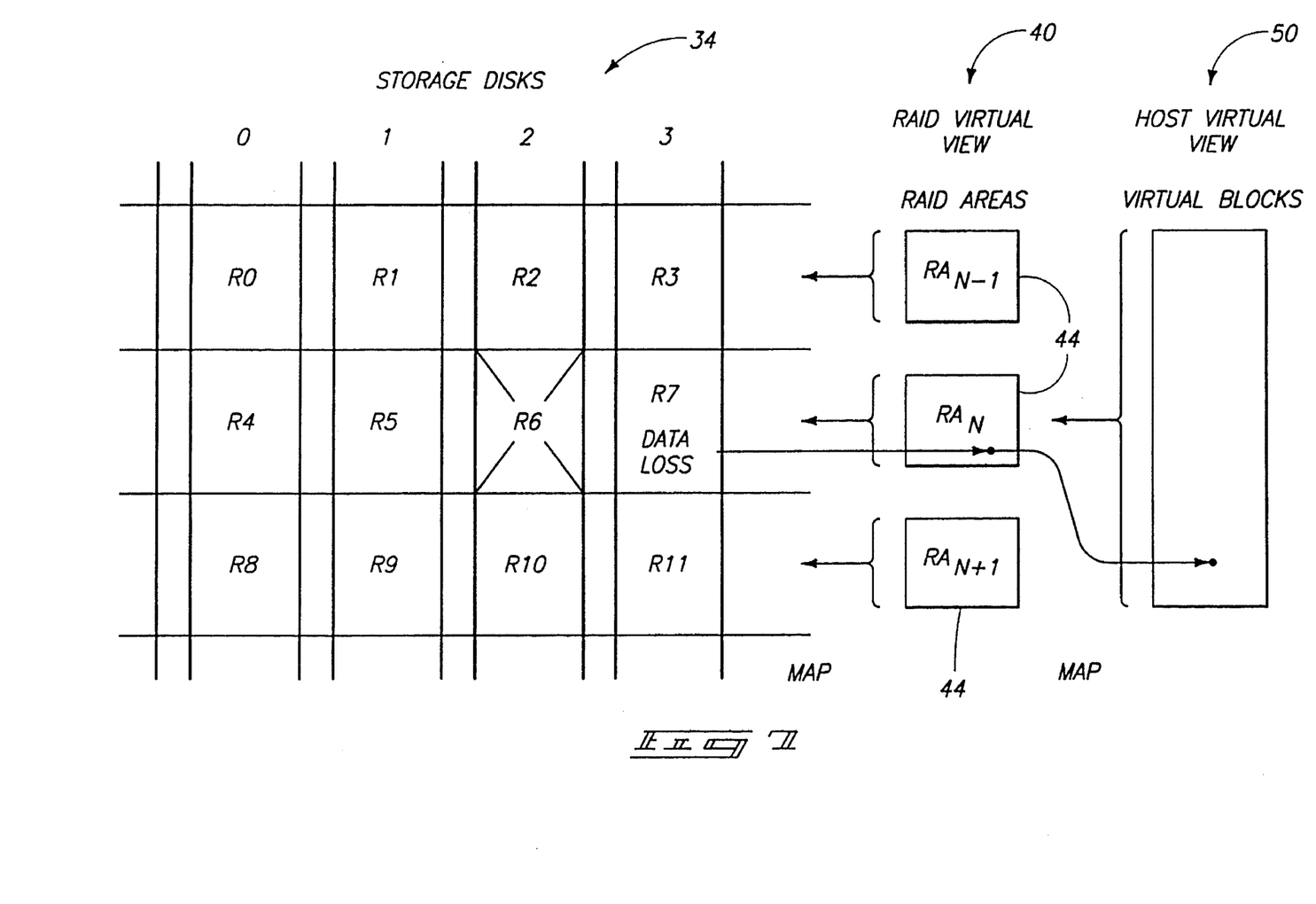
Figure 8:
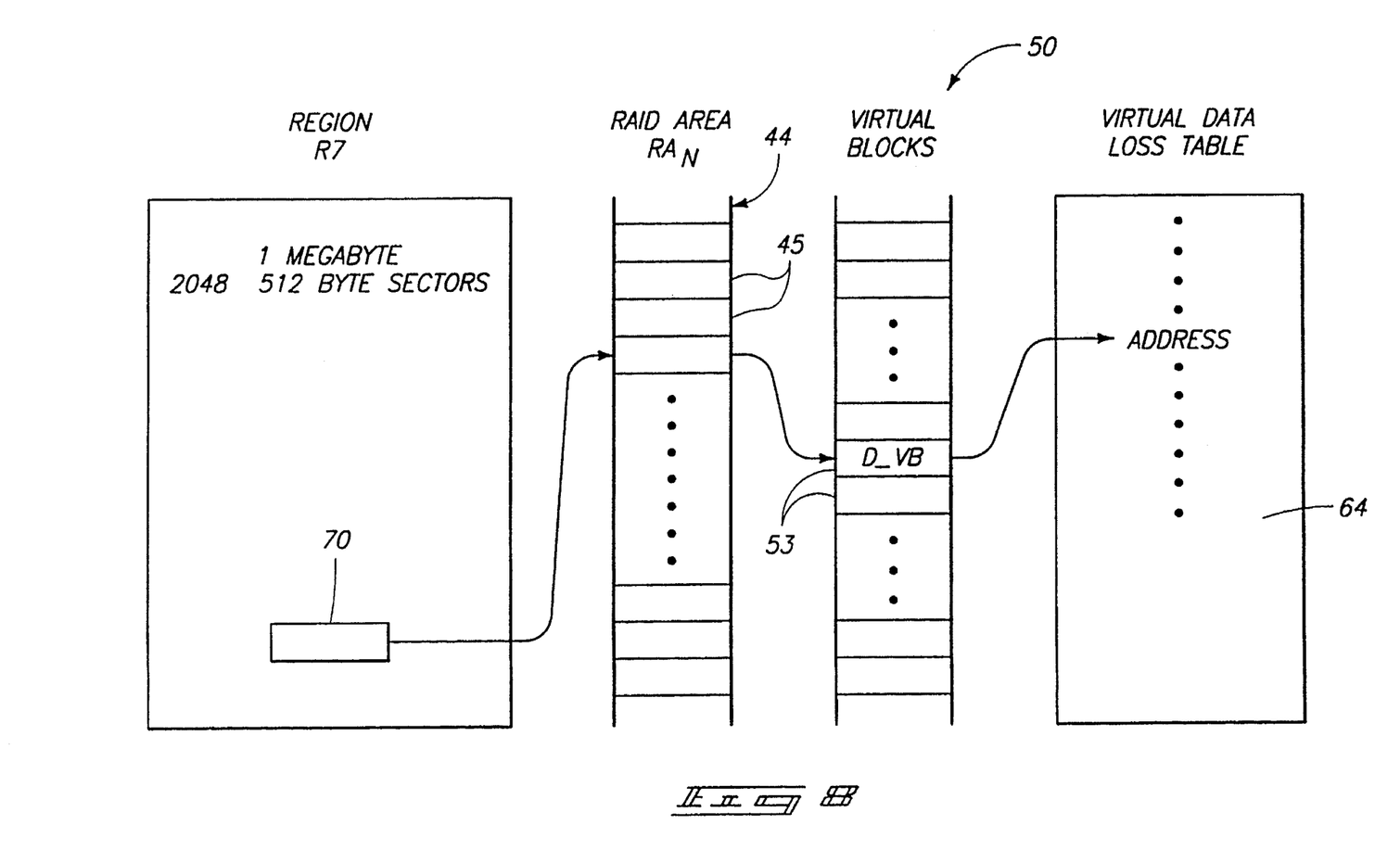
FIG. 8 shows the region of detected data loss in FIG. 7 in more detail, and the mapping of the defective portion of that region through the two virtual views.

FIGS. 7 and 8 demonstrate the use of virtual data loss table 64. Assume that RAID area $RA_N$ is "degraded" in that region R6 has already been declared invalid. Upon detecting data loss in a second region R7 of the degraded RAID area, the RAID management system 16 traces the location of that data loss via the mapping information through the first or RAID-level virtual view 40 and to the second or application-level virtual view 50 (FIG. 7). The virtual blocks at this application-level virtual view that are associated with the data loss can then be identified.

FIG. 8 shows this process in more detail. Assume that region R7 has a size of one Megabyte. This correlates to 2048 512-byte sectors on the physical disk drive device. Further assume that only one sector 70 in the entire region is the cause of the faulty data. The address of this sector is mapped through parity RAID area 44 to a virtual block 53 in application-level virtual view 50. Part of the data D_VB in this virtual block is faulty due to the failure in sector 70. Accordingly, the address of the sector within the associated virtual block is recorded in virtual data loss table 64.

The virtual data loss table 64 is preferably constructed to hold a small number of regions, such as one to three 1-Megabyte regions. This size correlates to approximately 16–48 64K virtual blocks. One possible implementation is a two tier table with one tier containing an addressing index of the 16–48 virtual blocks and a second tier containing an associated bit map representing the sectors associated with each virtual block entry. Since there are 128 51 2-byte sectors per 64K virtual block, the bit map is preferably a 128-bit map where each binary entry indicates whether the corresponding sector of the indexed virtual block contains invalid data.

Each record in the table 64 identifies a range of virtual addressing space in the system. All read operations are checked against the entries in the virtual data loss table 64. Any read accesses that overlap an identified range of data loss will return an unrecovered error. Apart from data loss in the single virtual block, however, the disk array controller can continue to read data from other sectors in region R7 as well as the remaining valid regions R4 and R5.

This method is beneficial because the entire 1M region is not declared invalid which would render the RAID area $RA_N$ dead. Thus, creation of a dead RAID area is avoided. During normal read operations, the list in table 64 is consulted to determine whether the data being read is valid, or is being read from a defective virtual block. The data storage system can list the virtual data ranges that are lost for the user's review. Active write store 66 maintains a list of all pending active write operations in the data storage system. When a write is initiated, it is listed in the active write store 66; and when completed, the write operation is removed from the list. The data storage system may attempt to write data to a defective virtual block listed in virtual data loss table 64. This will cause the defective virtual block to be removed from the virtual data loss table 64 unless the data was lost while the write operation was pending and listed in the active write store 66. A range overlap check is made after read and write operations are complete to account for concurrent activity that may have generated new virtual block ranges in the data loss table. A completed write cannot remove data loss from the table if the loss occurred while the write was in progress. The active write store 66 permits this checking procedure. In the preferred embodiment, the region sync table 62 and the virtual data loss table 64 are all resident and formed in NVRAMs 21a and 21b in the disk array controller 14. The active write store 66 is provided in volatile RAM of the disk array controller.

Various methods for monitoring data loss in the redundancy hierarchic data storage system 10 of this invention will now be described with reference to FIGS. 5–10.

Figure 9:
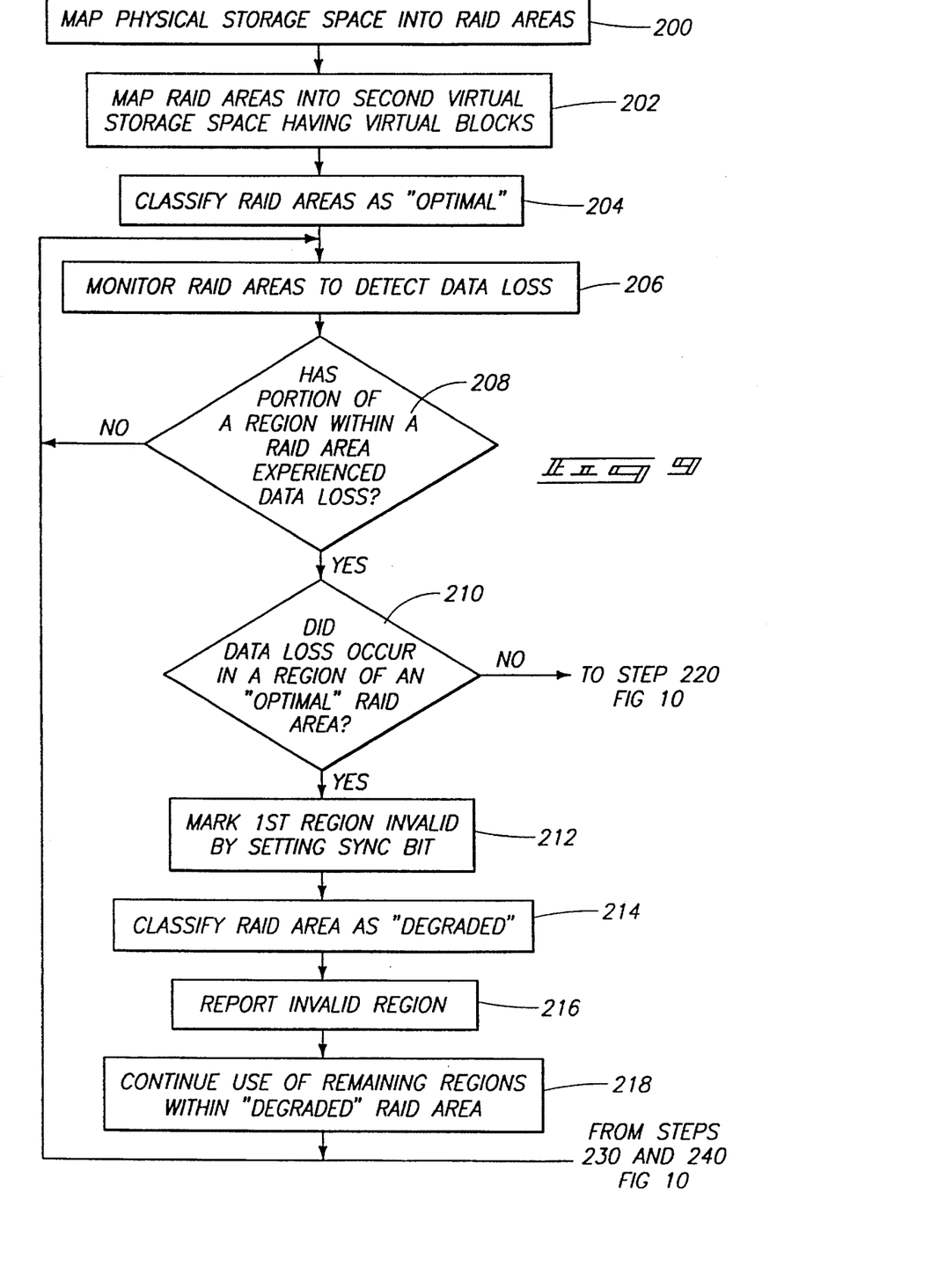
FIGS. 9 and 10 are a flow diagram of a method for monitoring data loss according to this invention.
Figure 10:
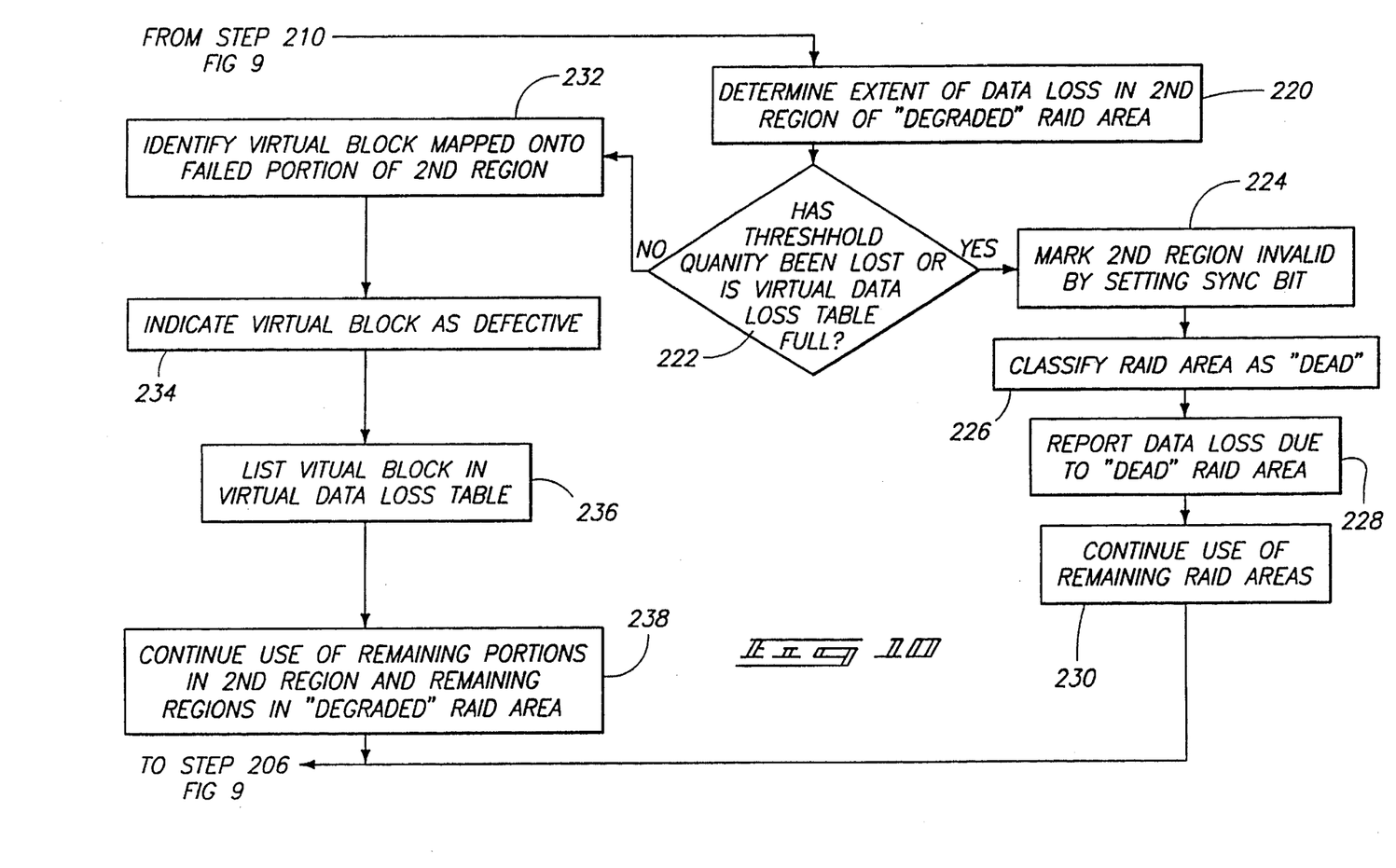

The first three steps in the flow diagram of FIGS. 9 and 10 properly set up the underlying RAID environment. At step 200, the physical storage space 34 is mapped into a first or RAID-level virtual is storage space 40 which presents the physical storage space as multiple RAID areas that store data according to various RAID levels, such as RAID Levels 1 and 5. The RAID areas are initially classified as "optimal" as no defects have yet been detected. At step 202, the first virtual storage space is mapped into a second or application-level virtual storage space 50 which presents the physical storage space as multiple virtual blocks.

The RAID areas are then monitored by data loss detector 60 during system operations to detect primitive data loss (step 206). At decision step 208, it is determined whether a portion of a region within a RAID area has been lost. If not, the process continues to monitor until data loss is detected. Upon detecting data loss, it is determined whether the loss occurred in a region of an "optimal" RAID area, meaning that the detected region would be the first region in its RAID area to experience data loss (step 210). If it is the first region, the region is marked invalid by setting the corresponding sync bit in region sync table 62 to a binary "0" (step 212). The RAID area is then classified as "degraded" at step 21 4. RAID area RA$_N$ in FIG. 6 pictorially represents a "degraded" RAID area.

At step 216, a warning that a region has been declared invalid is reported to the user. This is preferably done by sending a message to the host computer via interface 17 (FIG. 1). This message could be displayed on a monitor to alert the user to the redundancy loss. In this manner, this invention reports data loss at the time of occurrence and specifically indicates the amount of loss.

At this point, the disk array controller need only avoid addressing the invalid region. The remaining regions within the "degraded" RAID area, as well as the remaining RAID areas, can continue to be freely used to store user data.

Returning to step 210, if data loss occurs in a second region of an already "degraded" RAID area, the data storage system 10 will determine the extent of data loss (step 220, FIG. 10). If a substantial portion of data is lost in the second region, thereby exceeding a preselected threshold quantity, the entire second region is marked invalid by setting its associated sync bit at step 224. An example situation for this case is when most or all of the data is lost in the region. At this point, two regions in the RAID area have been found invalid and the entire RAID area is declared "dead" (step 226). RAID area RA$_{N+1}$ in FIG. 6 is an example of a "dead" RAID area. Data cannot be recovered from the invalid regions in the dead RAID area. The data loss resulting from the dead RAID area is reported to the user (step 228) by displaying a message on the host monitor during any access to the invalid regions in the dead RAID area. Alternatively, the data storage system can be equipped with a warning indicator to indicate when data is permanently lost due to a dead RAID area. Thereafter, user data is stored in the remaining RAID areas (step 230).

If it is determined at step 222 that less than a substantial amount of the second region fails (for example, only one or two sectors fail), the virtual block that maps onto the portion of the second region is identified at step 232. This process is diagrammatically illustrated in FIGS. 7 and 8, and explained above. The virtual block is temporarily marked as defective (step 234) and placed in the virtual data loss table 64 (step 236). It is noted that the virtual block need not be actually marked with tag or the like, but is simply indicated as being defective by virtue of it being added to the data loss table. The data storage system can include a warning light that indicates when the virtual data loss table contains virtual blocks. The RAID area remains in "degraded" status, with other regions in the RAID area available for data storage along with remaining portions of the failing second region (step 238).

The virtual blocks continue to be listed in the table until it is full. Once filled, there is no space to record the addresses of any more defective virtual blocks. Accordingly, as part of decision step 222, it is determined whether the virtual data loss table is full. If so, the second region containing the last identified defective virtual block is marked invalid and the entire RAID area is classified as dead (steps 224 and 226). At this point, any other virtual blocks listed in virtual data loss table 64 that were eliminated by virtue of classifying the RAID area as dead can be removed from the table, thereby freeing up more space to list addresses of future defective virtual blocks.

In perhaps the most preferred implementation, the data loss detector will always store defective virtual blocks in the table until it is full and forego the analysis of determining the extent of data loss in step 220. In this implementation, any time data loss is detected in a second region of a degraded RAID area, the virtual block is identified and listed in the table. There is no threshold comparison at steps 220 and 222 to determine whether much or little of the region experienced data loss.

It is noted that an alternative technique for freeing up space in the data loss table is to seek the largest group of virtual blocks that relate to the same RAID area. The RAID area can then be declared as "dead" and all virtual blocks related thereto can be removed from the virtual data loss table.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for monitoring data loss in a hierarchic data storage system having multiple storage disks that define a physical storage space; the method comprising the following steps:

(a) mapping the physical storage space into a first virtual storage space which presents the physical storage space as multiple RAID areas that store data according to various RAID levels, individual RAID areas extending across multiple storage disks and comprising a region of physical storage space on individual storage disks, individual RAID areas being initially classified as an optimal RAID area in which data can be stored and retrieved with redundancy;

(b) mapping the first virtual storage space into a second virtual storage space which presents the physical storage space as multiple virtual blocks;

(c) monitoring the RAID areas to detect loss of stored data;

(d) upon detecting data loss within a first region of a RAID area, marking the first region as an invalid region and classifying the RAID area as a degraded RAID area in which data can be stored and retrieved in that RAID area, but without redundancy; and (e) upon detecting data loss within a second region of the degraded RAID area, classifying the RAID area as a dead RAID area in which data cannot be recovered from the first and second regions of that dead RAID area.

2. A method according to claim 1 further comprising the step of continuing to use other RAID areas that have not been classified as dead.

3. A method according to claim 1 further comprising the step of reporting to a user information concerning data loss as a result of the invalid regions and dead RAID areas.

4. A method for monitoring data loss in a hierarchic data storage system having multiple storage disks that define a physical storage space; the method comprising the following steps:

(a) mapping the physical storage space into a first virtual storage space which presents the physical storage space as multiple RAID areas that store data according to various RAID levels, individual RAID areas extending across multiple storage disks and comprising a region of physical storage space on individual storage disks, individual RAID areas being initially classified as an optimal RAID area in which data can be stored and retrieved with redundancy;

(b) mapping the first virtual storage space into a second virtual storage space which presents the physical storage space as multiple virtual blocks;

(c) monitoring the RAID areas to detect loss of stored data;

(d) upon detecting data loss within a first region of a RAID area, marking the first region as an invalid region and classifying the RAID area as a degraded RAID area in which data can be stored and retrieved in the RAID area, but without redundancy;

(e) upon detecting data loss within a portion of a second region of the degraded RAID area, identifying a virtual block that is mapped onto the portion of the second region;

(f) indicating that the identified virtual block is a defective virtual block; and (g) continuing to use remaining portions of the second region and any remaining regions within the degraded RAID area to store data without classifying the RAID area as dead.

5. A method according to claim 4 further comprising the additional step of listing the defective virtual block in a virtual data loss table.

6. A method according to claim 5 further comprising the following additional steps:

continuing to list defective virtual blocks in the virtual data loss table until the virtual data loss table is full; and thereafter, upon detecting data loss within another portion of the second region of the degraded RAID area, marking the second region as invalid and classifying the RAID area as a dead RAID area in which data cannot be recovered from the first and second regions of the dead RAID area.

7. A method according to claim 5 further comprising the following additional steps:

writing data to the defective virtual block; and removing the defective virtual block from the virtual data loss table and indicating that the virtual block is no longer defective.

8. A method according to claim 4 wherein prior to the step of identifying a virtual block in step (e), the following additional steps are conducted in lieu of steps (e)–(g) upon detection of data loss within a portion of the second region of the degraded RAID area:

first determining an extent of data loss within the second region;

marking the second region invalid in an event that a threshold quantity of the second region fails; and classifying the RAID area as a dead RAID area in which data cannot be recovered from the first and second regions of the dead RAID area.

9. A method according to claim 4 further comprising the step of reporting to a user information concerning data loss as a result of the invalid regions and dead RAID areas.

10. A method for monitoring data loss in a hierarchic data storage system having multiple storage disks that define a physical storage space; the method comprising the following steps:

(a) mapping the physical storage space into a first virtual storage space which presents the physical storage space as multiple RAID areas that store data according to various RAID levels, individual RAID areas extending across multiple storage disks and comprising a region of physical storage space on individual storage disks;

(b) mapping the first virtual storage space into a second virtual storage space which presents the physical storage space as multiple virtual blocks;

(c) monitoring the RAID areas to detect loss of stored data;

(d) upon detecting data loss within a region of a RAID area, identifying a virtual block that is mapped onto a portion of the region;

(e) indicating that the identified virtual block is a defective virtual block; and (f) continuing to use remaining portions of the region and remaining regions within the RAID area to store data.

11. A method according to claim 10 further comprising the additional step of listing the defective virtual block in a virtual data loss table.

12. A method according to claim 10 further comprising the following additional steps;

listing a virtual address range of the defective virtual block in a virtual data loss table;

checking addresses involved in read operations against the virtual address range in the virtual data loss table; and returning an error signal when the address involved in a read operation overlaps the virtual address range.

13. A method according to claim 10 further comprising the following additional steps:

writing data to the defective virtual block; and removing the defective virtual block from the virtual data loss table and indicating that the virtual block is no longer defective.

14. A method according to claim 10 wherein prior to the step of identifying a virtual block in step (d), the following additional steps are conducted in lieu of steps (d)–(f) upon detection of data loss within a region of a RAID area:

first determining an extent of data loss within the region; and marking the region invalid in an event that a threshold quantity of the region fails.

15. A hierarchic data storage system comprising:

a disk array having a plurality of storage disks that define a physical storage space;

a disk array controller coupled to the disk array for writing data to and reading data from the storage disks;

a RAID management system operatively coupled to the disk array controller for mapping first and second virtual storage spaces onto the physical storage space of the storage disks; the first virtual storage space presenting the physical storage space as multiple RAID areas that store data according to various RAID levels, individual RAID area extending across multiple storage disks and comprising a region of physical storage space on individual storage disks; the second virtual storage space presenting the physical storage space as multiple virtual blocks; and a data loss detector to selectively track data loss that occurs within individual RAID areas, the data loss detector including a region sync table which contains multiple indicators that represent whether individual regions are alternately (1) valid and have not experienced any data loss or (2) invalid and have experience some data loss.

16. A hierarchic data storage system comprising:

a disk array having a plurality of storage disks that define a physical storage space;

a disk array controller coupled to the disk array for writing data to and reading data from the storage disks;

a RAID management system operatively coupled to the disk array controller for mapping first and second virtual storage spaces onto the physical storage space of the storage disks; the first virtual storage space presenting the physical storage space as multiple RAID areas that store data according to various RAID levels, individual RAID areas extending across multiple storage disks and comprising a region of physical storage space on individual storage disks; the second virtual storage space presenting the physical storage space as multiple virtual blocks;

a data loss detector to selectively track data loss that occurs within individual RAID areas, the data loss detector being configured to detect data loss within a region of a RAID area and identify in the second virtual storage space a defective virtual block that is mapped onto a portion of the region; and the data loss detector including a virtual data loss table to store a virtual address of the defective virtual block.

17. A hierarchic data storage system comprising:

a disk array having a plurality of storage disks that define a physical storage space;

a disk array controller coupled to the disk array for writing data to and reading data from the storage disks;

a RAID management system operatively coupled to the disk array controller for mapping first and second virtual storage spaces onto the physical storage space of the storage disks; the first virtual storage space presenting the physical storage space as multiple RAID areas that store data according to various RAID levels, individual RAID areas extending across multiple storage disks and comprising a region of physical storage space on individual storage disks; the second virtual storage space presenting the physical storage space as multiple virtual blocks;

a data loss detector to selectively track data loss that occurs within individual RAID areas, the data loss detector including an active write store that maintains a list of all pending active write operations in the data storage system, a write operation being removed from the active write store upon completion;

the disk array controller attempts to write data to the defective virtual block; and the data loss detector removes the defective virtual block from the virtual data loss table unless the data was lost while the write operation was pending and listed in the active write store.

18. A hierarchic data storage system comprising:

a disk array having a plurality of storage disks that define a physical storage space;

a disk array controller coupled to the disk array for writing data to and reading data from the storage disks;

a RAID management system operatively coupled to the disk array controller for mapping first and second virtual storage spaces onto the physical storage space of the storage disks; the first virtual storage space presenting the physical storage space as multiple RAID areas that store data according to various RAID levels, individual RAID areas extending across multiple storage disks and comprising a region of physical storage space on individual storage disks; the second virtual storage space presenting the physical storage space as multiple virtual blocks;

a data loss detector to selectively track data loss that occurs within individual RAID areas, the data loss detector being configured to detect data loss within a region of a RAID area;

the data loss detector including a region sync table which contains multiple sync bits for corresponding regions, individual sync bits having a first binary value to indicate that a corresponding region is a valid region and has not experienced any data loss and a second binary value to indicate that a corresponding region is an invalid region and has experienced some data loss;

whereupon detection of data loss within a first region of a RAID area, a sync bit associated with the first region is set to the second binary value indicating that the first region is an invalid region and the disk array controller avoids writing data to that invalid region;

the data loss detector being further configured to identify in the second virtual storage space a defective virtual block that is mapped onto a portion of a region;

the data loss detector including a virtual data loss table to store a virtual address of the defective virtual block; and whereupon detection of data loss within a second region of a RAID area that already contains an invalid region, the address of the defective virtual block is added to the virtual data loss table and the disk array controller continues to access data in remaining portions of the second region and remaining regions within the same RAID area.

19. A hierarchic data storage system according to claim 18 wherein:

the disk array controller includes non-volatile RAM; and the region sync table and the virtual data loss table are resident in the non-volatile RAM.

* * * * *